United States Patent [19]

Dhillon

[11] 4,452,877

[45] Jun. 5, 1984

[54] ELECTROLYSIS TREATMENT OF LIGHT SENSITIVE DIAZO COATED SUPPORTS

[75] Inventor: Major S. Dhillon, Hillsborough, N.J.

[73] Assignee: American Hoechst Corporation, Somerville, N.J.

[21] Appl. No.: 412,049

[22] Filed: Aug. 26, 1982

[51] Int. Cl.[3] ........................ G03C 1/76; G03C 1/54; G03F 7/16

[52] U.S. Cl. ........................ 430/168; 430/32; 430/38; 430/52; 430/141; 430/169; 430/175; 430/176; 430/300; 430/302; 430/327; 204/17; 204/5.6; 204/38 E; 204/58; 204/37.6

[58] Field of Search ..................... 430/32, 38, 52, 141, 430/168, 169, 175, 176, 327, 302, 300; 204/17, 35 N, 38 E, 58

[56] References Cited

U.S. PATENT DOCUMENTS

| | | | |
|---|---|---|---|
| 2,541,488 | 2/1951 | Vanselow et al. | 430/149 |
| 3,445,654 | 5/1969 | Loprest | 430/52 |
| 3,462,267 | 8/1969 | Giangualano et al. | 430/156 |
| 3,562,119 | 2/1971 | Krueger | 430/168 |
| 3,600,173 | 8/1971 | Levinos | 430/52 |
| 3,849,132 | 11/1974 | Wells et al. | 430/33 |
| 3,881,998 | 5/1975 | Miyosawa . | |
| 4,152,158 | 5/1979 | Chu | 430/302 |
| 4,263,392 | 4/1981 | Jones | 430/327 |
| 4,414,311 | 11/1983 | Walls . | |

OTHER PUBLICATIONS

Chemical Abstracts, Abstract #81:97776r, 1974 (Matsuda et al.).

*Primary Examiner*—Charles L. Bowers, Jr.
*Attorney, Agent, or Firm*—Richard S. Roberts

[57] ABSTRACT

Presensitized lithographic printing plates, having extended press run life, are provided by electrolytically passing a current through the light-sensitive material in the prefabricated plate. Press runs of up to sixty percent longer than expected are possible with plates which are so treated.

16 Claims, No Drawings

ELECTROLYSIS TREATMENT OF LIGHT SENSITIVE DIAZO COATED SUPPORTS

BACKGROUND OF THE INVENTION

This invention relates to photosensitive elements, particularly lithographic printing plates, which are produced by imagewise exposing a photosensitive layer on a substrate and washing away the soluble material to develop the image. More particularly, it relates to such printing plates having a metallic backing, such as aluminum, to which the light-sensitive layer is firmly bonded prior to imaging.

Diazo printing plates are widely used in the image reproduction industry, specifically as planographic and offset printing plates. Well known to the industry are the planographic printing plates produced by, for example, the Kalle division of Hoechst AG, and the ENCO group of the American Hoechst Corporation. Positive and negative-working systems are known, depending upon whether the action of light renders the photosensitive portion of the plate relatively more or less soluble than the unexposed portion. Typically, a light-sensitive diazo resin, diazonium salt, quinone diazide or photopolymerizable composition is dispersed in a binding material which is then coated onto a support surface and allowed to dry. The composition may also optionally include other constituents, such as other resins, dyes, pigments, colorants, plasticizers, light speed accelerators, photosensitizer stabilizers, fillers and the like which are well known to the skilled artisan.

Examples of suitable supports onto which the light-sensitive composition is coated are metal supports such as aluminum, steel, zinc, copper, brass, chromium, and so forth. Metal supports are distinctly preferred for long printing runs, and aluminum and aluminum alloys are usually employed. The art has found that the best results are achieved when the aluminum supports are subjected to a variety of pretreatments which enable the light-sensitive composition to be firmly bonded to the metal, in order to achieve optimum press run life and image sharpness. A currently preferred aluminum support pretreatment first anodically produces a layer of aluminum oxide on the aluminum surface, which is then reacted with a hydrophilizing polyvinyl phosphonic acid solution. This is taught in U.S. Pat. No. 4,153,461. Many other hydrophilizing agents are known to the skilled artisan.

For a thorough disclosure of methods for producing photosensitive diazo-containing printing plates and other photosensitive elements, reference is made to U.S. Pat. Nos. 3,679,419 and 3,849,392. Optically-homogeneous negative-working presensitized planographic printing plates are disclosed in U.S. Pat. No. 4,288,520.

Commercial diazo printing plates can be and are designed for use in a fairly wide range of expected press run life cycles. Examples include negative-working printing plates known as ENCO® N-25, N-50, N-100 and N-200 plates available from American Hoechst Corporation. These plates have anticipated press runs of 25,000, 50,000, 100,000 and 200,000 respectively. Some of the many factors determining the durability or press run life of a printing plate include the thickness and type of resin binder in the coating, support type and support pretreatments. It is the aspiration of the art to improve the press run life of a printing plate without diminishing the quality of the images made therefrom.

SUMMARY OF THE INVENTION

The present invention provides an improved photosensitive printing plate having a press run life which is significantly extended by subjecting the photosensitive plate to an electrolytic current prior to exposure, using the metal support layer of the plate as one of the electrodes. The electrolyte comprises a current carrying ionizing specie which is preferably a weak solution of an acid. The press run life of plates so treated can be up to 60% or greater than plates produced without such electrolysis.

DETAILED DESCRIPTION OF THE PREFERRED EMBODIMENT

In the production of a photographic element, a sheet substrate, preferably aluminum and the alloys thereof especially those aluminum compositions suitable for the manufacture of lithographic printing plates such as Alcoa 3003 and Alcoa 1100, which may or may not have been pretreated by standard graining and/or etching and/or anodizing techniques as are well known in the art, may be coated by spraying, brushing, dipping or other means with a composition suitable for use as an interlayer for lithographic plates. Standard metal substrate pretreatments include electrolytically anodizing in sulfuric and/or phosphoric acids, electrolytically etching in hydrochloric acid, and chemical or mechanical graining by methods, which are all known to the skilled worker. Interlayer compositions employable in the practice of this invention include aqueous solutions of alkali silicate and polyvinyl phosphonic acid.

The substrate is then coated by means well known in the art with a photosensitive coating which in the preferred embodiment comprises a negative working diazo photosensitizer and may contain suitable colorants, resins, acid stabilizers, phosphoric acid and other art recognized ingredients and dried.

The thusly prepared and coated substrate is then subjected to an electrolysis treatment by making the metallic substrate an electrode, dipping it in a suitable electrolytic bath, inserting at least one additional electrode in said bath and applying either alternating or direct current thereto. In the preferred embodiment, direct current is employed.

The light sensitive coating of the present invention may be selected from diazonium salts, usually polymeric condensates, quinone diazides and photopolymers. In the preferred embodiment, polymeric diazonium salts are used. Of these, the most preferred is the reaction product of the condensation of 4,4'-bis-methoxymethyl diphenyl ether with 3-methoxy-4-diazo diphenyl amine sulfate isolated as the mesitylene sulfonate salt. This and other useful compounds are discussed in U.S. Pat. Nos. 3,849,392. The coating preferably contains binding resins. Examples of these include polyvinyl acetals; copolymers of styrene and maleic anhydride; polymethyl methacrylate/methacrylic acid copolymer; copolymers of methyl vinyl ether and maleic anhydride; styrene and methacrylic acid copolymer; and polymethacrylic acid/acrylic acid copolymer. Other suitable light sensitive compositions are disclosed in U.S. Pat. Nos. 3,849,392 and 3,679,419 which are incorporated hereby by reference.

The electrochemical treatment of presensitized diazo printing plates, which is a primary subject of the present invention, has as its principal motivation the theory that the diazo molecule ions will experience a preferred orientation towards the metal support of the printing plate when a potential is applied to the metal during electrolysis. It is theorized, for example, where the printing plate is electrochemically treated in a solution of an organic or inorganic acid, that significant penetration of the acid ions into the diazo-binder matrix will take place and an integrated adhesion of the various layers with the metal support will be achieved. This result, when combined with the expected forced migration or orientation of the diazo ions toward the metal support, is thought to be the main reason why plates so treated wear and last longer during printing press runs.

Under the above theory, the electrochemical treatment of printing plates of this invention is essentially different from the prior art anodization, cathodization and electrochemical graining of the metal support because the surface of the metal is covered by the light sensitive composition. The electrochemical action would be expected to begin on the top of the sensitizing layer under the influence of the applied potential. Where cathodization is applied to the plate, the cation part of the diazo molecule should have preferred orientation towards the metal, while in the anodization variation, the anion part of the diazo molecule will have preferred orientation toward the metal. Since the diazo molecules are held in the diazo-binder composition and are not able to ionize completely and move about freely, the restricted motion of the diazo molecules will, however, allow the cation and anion to have these preferred orientations on the metal support.

The method of this invention thus comprises, in its preferred embodiment, the immersion of a photosensitive, preferably diazo printing plate in an ionizing, preferably acidic bath, and applying an electrical potential difference between the metal support of the printing plate as one electrode, and another electrode immersed in the same bath.

The metal support of the printing plate may be used as either the cathode or the anode during the inventive process. The current passed through the plate during the electrolytic treatment may be either alternating or direct current. The strength of the electric field, while not critical to this invention per se, is preferably from about 0.5–50 volts, more preferably 0.75 to 40 volts, and still more preferably 1 to 30 volts. The other electrode is preferably composed of stainless steel, lead, tantalum, antimony, chromium or alloys thereof in bar, sheet, or expanded screen form. It has been found that excellent results are achieved when a current density of about 0.1–15 ampere-minutes per square meter is passed through the plate. Preferably, a current consumption of about 0.3–about 10.0 and more preferably 0.5 to 2.5 ampere-minutes per square meter is desired. As before stated, either alternating or direct current may be applied, and it has additionally been found that pulsed direct current will also give advantageous results.

The electrolyte comprises a current carrying solution containng ionized species. However, it is preferred to utilize aqueous solutions of acids, acid mixtures, salts of the acids, or polymeric conducting materials. Representative of the acids which may be used in aqueous solution are sulfuric, phosphoric, nitric, hydrochloric, fluoboric, acetic, hexafluorophosphoric, methane sulfonic, and polyvinyl phosphonic. Representative of the acid mixtures would be sulfuric and phosphoric, sulfuric and hydrochloric, sulfuric and nitric, sulfuric and fluoboric, sulfuric and acetic, sulfuric and boric, phosphoric and hydrochloric, phosphoric and nitric, phosphoric and fluoroboric, and phosphoric and acetic although others are also useful. Representative of the acid salts are sodium nitrate, aluminum nitrate, sodium chloride and the sodium salt of styrene maleic anhydride copolymer. The most preferred electrolyte is an aqueous solution of polyvinyl phosphonic acid.

The concentration of acids, acid mixtures, acid salts and polymeric conducting materials in water usually ranges from about 0.05–about 40% by weight, preferably 0.1 to 10% and more preferably 0.5–2.5% by weight. Where polyvinyl phosphonic acid is used, the preferred concentration is about 1% in water.

The temperature of the electrolyte bath is not critical, but is desirably held at a temperature of about 0° C. to about 70° C., more preferably 5° C. to 50° C., most preferably about 15°–30° C.

The following non-limiting examples serve to illustrate the invention.

CONTROL 1

A presensitized printing plate is prepared by roughening the surface of a web of aluminum by surface graining to increase the surface area. The roughened plate is well rinsed and subsequently rendered hydrophilic by treatment with polyvinyl phosphonic acid as taught in U.S. Pat. No. 4,153,461. The treated plate is again well rinsed and dried.

The metal surface thusly prepared in then coated with a light-sensitive coating composition at a coating weight of 750 mg/m$^2$. The light-sensitive coating contains the reaction product of the condensation of 4,4′-bis-methoxy-methyl diphenyl ether with 3-methoxy-4-diazo diphenyl amine sulfate, isolated as the mesitylene sulfonate salt and FORMVAR (12/85) which is a polyvinyl acetal resin available from Monsato. The coating solutions also contain HOSTAPERM phthalocyanine Green Dispersion and Blue Dispersion pigments available from Hoechst AG, as well as a phosphoric acid diazo stabilizer in a method well known to the skilled artisan.

The thusly prepared presensitized plates are cut into several 24″×8″ pieces, and one piece is exposed with a mercury vapor light source using a test flat having 21 Step Stouffer step wedge, with each increasing step representing a change in density equal to square root of 2. Each test plate is exposed with 30 BAU (1 BAU is approximately equal to 10 mJ/cm$^2$). The exposed plate is then developed with ENCO subtractive developer and treated with ENCO subtractive finisher. The plate is then press ready. The plate gives 30,000 acceptable press impressions under abrasive conditions using excessive plate pressure and abrasive inks.

CONTROL 2

The control 1 is repeated, except the grained aluminum surface is anodized in $H_2SO_4$ to an oxide weight of approximately 1.0 g/M$^2$ prior to hydrophilizing. The processed plate gives 55,000 impressions under the above noted abrasive conditions.

CONTROL 3

Control 2 is repeated except the binder resin used is a copolymer of methyl methacrylate and ethyl methacrylate. The exposed plate is developed with Western Jet black (medium) developer and treated with EGP etch gum preserver. The processed plate gives 40,000 impressions on a press under the noted abrasive conditions.

EXAMPLE 1

An electrolytic bath (27"×23"×14") is equipped with two interconnected stainless steel screen electrodes (26"×18"). The bath is filled with 86 liters of 1.0% aqeuous solution of (85%) phosphoric acid. The steel screen electrodes are connected to a power supply and are made the cathode. The presensitized plate (24"×8") of control 1 is held in the middle of the bath and the two steel electrodes are positioned on both sides of the printing plate. The steel screens are kept at a distance of 3.5" on each side of the presensitized plate. The presensitized plate is made the anode and connected to the power supply. Direct current is used to electrolyze the plate at a current consumption of 1.0 ampere-minute at approximately 30 volts. The anodized plate is washed with deionized water (D.I.$H_2O$) and blotted dry.

The dried plate is exposed, developed and finished as described in control 1 and made press ready. The processed plate gives 45,000 press impressions under the abrasive conditions.

EXAMPLE 2

Example 1 is repeated, except a current density of 5.0 ampere-minutes per square meter is used to electrolyze the presensitized plate. The plate on exposure, developing and finishing acccording to the method of control 1 gives 45,000 press impressions under the abrasive conditions.

EXAMPLE 3

Example 1 is repeated except the presensitized plate is made the cathode and stainless steel screens are made the anode. A current consumption of 7.5 ampere-minutes is used to treat the plate with voltage at approximately 30 volts. The electrochemically treated plate is exposed to 30 BAU, developed with a subtractive developer and treated with a subtractive finisher. The processed plate gives 40,000 press impressions under the abrasive press conditions.

EXAMPLE 4

The electrolyte bath as described in example 1 is used to electrochemically treat the presensitized plates made according to the procedure of control 2. The electrolytic bath is filled with a 1% aqueous solution of polyvinyl phosphonic acid. The presensitized plate is made the anode. Direct current is used to electrolyze the plate at a current consumption of 3.0 ampere-minutes at 30 volts. The anodized plate is washed with deionized water and blotted dry. The dried plate is exposed, developed and finshed as in control 1. The processed plate gives 70,000 press impressions under the abrasive press conditions.

EXAMPLE 5

Example 4 is repeated except the presensitized plate is made the cathode and stainless steel screens are made the anode. A current consumption of 3.0 ampere-minutes is employed to treat the plate at 30 volts. The processed plate, according to the procedure of example 1, gives 70,000 press impressions under the abrasive press conditions.

EXAMPLE 6

Example 4 is repeated except that the presensitized plate as made in control 3 is used for electrochemical treatment. The plate is developed with Western Jet black (medium) developer and treated with EGP etch gum preserver. The processed plate gives 50,000 press impressions under the abrasive press conditions.

What is claimed is:

1. A method for producing a photosensitive printing plate having extended press run life which comprises providing a metal support comprising aluminum or the alloys thereof bearing a light sensitive coating composition comprising a negative working diazo sensitizer on at least one surface of said support and subsequently electrolytically passing a current through the light-sensitive composition via an electrolyte comprising a current carrying ionizing specie while the metal support acts as one electrode wherein the electrolysis of said element is conducted solely after first providing said support with said light sensitive coating, and wherein said electrolysis is conducted solely prior to imagewise light exposure of said element.

2. The method of claim 1 in which the coated support is immersed in an electrolyte which comprises an aqueous solution of a material selected from the group consisting of acids, acid salts, polymeric conducting materials, and mixtures thereof.

3. The method of claim 2 wherein said electrolyte comprises an aqueous solution containing one or more materials selected from the group consisting of sulfuric, phosphoric, nitric, hydrochloric, fluoboric, acetic, hexafluorophosphoric, methane sulfonic, polyvinyl phosphonic acids.

4. The method of claim 2 wherein said electrolyte comprises an aqueous solution containing one or more materials selected from the group consisting of sodium nitrate, sodium chloride, aluminum nitrate, aluminum chloride, and the sodium salt of styrene maleic anhydride copolymer.

5. The method of claim 2 wherein the electrolyte comprises an aqueous solution of polyvinyl phosphonic acid.

6. The method of claim 2 wherein the concentration of said electrolyte ranges from about 0.05 to about 40% by weight.

7. The method of claim 1 in which the electrolytic current passed through the light-sensitive composition ranges from about 0.5 to about 15 ampere-minutes per square meter.

8. The method of claim 7 wherein said current is applied at a voltage of from about 0.5 to about 30 volts.

9. The method of claim 1 wherein said diazo compound is a condensed diazonium salt.

10. The method of claim 1 wherein said diazo compound is the reaction product of the condensation of 4,4'-bis-methoxy-methyl diphenyl ether with 3-methoxy-4-diazo diphenylamine sulfate isolated as the mesitylene sulfonate salt.

11. The method of claim 1 wherein said light-sensitive composition comprises a binding resin selected from the group consisting of polyvinyl acetals; copolymers of styrene and maleic anhydride; polymethyl methacrylate/methacrylic acid copolymer; copolymers of methyl vinyl ether and maleic anhydride; styrene and methacrylic acid copolymer; and polymethacrylic acid-/acrylic acid copolymer.

12. The printing plate produced by the method of claim 11 wherein said light sensitive coating composition comprises one or more polymeric condensates of diazonium salts.

13. The method of claim 1 wherein said light-sensitive composition further comprises one or more materials selected from the group consisting of binding resins, colorants, plasticizers, light speed accelerators and photosensitizer stabilizers.

14. The printing plate produced by the method of claim 13 wherein said light sensitive coating composition comprises one or more polymeric condensates of diazonium salts.

15. The method of claim 1 wherein a hydrophilizing agent is disposed between said support and said light-sensitive coating.

16. The method of claim 15 wherein said hydrophilizing agent is selected from the group consisting of polyvinyl phosphonic acid and alkali metal silicates.

* * * * *